INVENTORS
ROY G. KRAMER
BY
Boniard I. Brown
ATTORNEY

United States Patent Office 3,541,230
Patented Nov. 17, 1970

3,541,230

COMBINATION INSULATING AND STAND-OFF COVER FOR TRANSISTORS AND THE LIKE

Roy G. Kramer, 1342 Signal Drive, Pomona, Calif. 91716

Filed Apr. 29, 1968, Ser. No. 724,840
Int. Cl. H05k 5/03
U.S. Cl. 174—138 4 Claims

ABSTRACT OF THE DISCLOSURE

A combined insulating and stand-off cover is provided for electrical circuit elements such as transistors and the like having terminals for connection to a circuit board. The cover is a cap which fits over the circuit element to isolate the latter from other conductors on the circuit board and projecting stand-off lugs which seat against the board to space the circuit element from the board.

BACKGROUND OF THE INVENTION

Field of the invention

This invention relates generally to electrical circuit elements such as transistors and the like and more particularly to a combined insulating and stand-off cover for such circuit elements.

Prior art

A variety of electrical and electronic equipment embodies electrical circuitry including a printed circuit board or the like and transistors and other circuit elements having terminals which are soldered or otherwise welded to conductors on the board. Circuits of this type present two problems which this invention seeks to solve. One of these problems resides in the fact that circuits of the class described generally have a large number of conductors and other circuit elements crowded into a relatively small area. As a consequence, precautionary measures must be taken to electrically shield the elements from one another to prevent electrical shorts. In the absence of such precautionary measures, for example, electrical shorts often occur as a result of contact of a conductor with the metallic case of a transistor. The second problem referred to above concerns the fact that the metallic case of a circuit element such as a transistor must be spaced or otherwise electrically insulated from the circuit board to prevent contact of the case with conductors, solder, and the like, on the board which might create an electrical short.

Heretofore, these problems have been solved by enclosing the metallic case of certain elements, such as transistors, in an insulating cover and by placing an insulating stand-off pad between the circuit element and the circuit board. However, the existing circuit element insulators and stand-off pads are deficient in several respects. One of the disadvantages of the existing insulating and stand-off devices, for example, resides in the fact that they comprise two separate items, i.e., the insulating cover and the stand-off pad, which must be separately fabricated and separately installed or assembled on each circuit element. As a consequence, the labor and costs involved in both fabricating and installing the devices are increased. Moreover, the installation procedure involved in assembly of each item of the existing insulating and stand-off devices on a circuit element is relatively difficult, tedious, and time-consuming. Installation of a stand-off pad on a transistor, for example, requires insertion of the fine wire terminals or leads of the transistor through small pin holes in the pad. Not only is this assembly procedure tedious and time-consuming to accomplish, but further, the transistor terminals are frequently bent or otherwise damaged in the process. Installation of the existing insulating covers, on the other hand, requires initial insertion of the cover over the circuit element to be protected and subsequent heating of the cover by a hot air blower, or the like, to heat shrink the cover about the circuit element. Obviously, this cover installation procedure is also quite tedious and time-consuming.

Another disadvantage of the existing circuit element protective devices of the kind under discussion is that heating of the insulating covers to heat shrink the latter about the circuit elements often damages the elements. This is particularly true of transistors whose crystals are frequently damaged and whose electrodes are frequently corroded by the hot air from the hot air blower. Such corrosion of the terminals renders difficult, if not impossible, proper soldering or welding of the terminals to the circuit board and often results in poor electrical connections unless the terminals are properly cleaned.

The existing circuit element insulators and stand-off devices are deficient from yet another standpoint. Thus, the stand-off pads of these devices have a solid disc-like shape and seat at one side against the circuit element to be protected and at the opposite side against the circuit board. As a consequence, any loose solder or other foreign matter between the circuit board and the circuit element is effectively trapped and is thus extremely difficult if not impossible to remove. Removal of such loose solder and other foreign matter is desirable to prevent short circuits and other malfunctioning of the completed circuit board.

The present invention provides an improved insulating and stand-off device of the class described which avoids the above-noted deficiencies of the existing devices. A major advantage of the present device, for example, results in the fact that it constitutes a unitary item which serves the dual function of an insulator and a stand-off. This device may be mass produced in one piece by an injection molding technique or other mass production process.

Another major advantage of the present insulating and stand-off device is that it may be installed or assembled on a circuit element, such as a transistor, by a single simple assembly step. This assembly step does not entail any heating of the insulator and stand-off device or exposure of the latter to an otherwise hostile medium which might damage the circuit element.

Yet another advantage of the present combined circuit element insulator and stand-off device is that it leaves an open space between the circuit element and the circuit board from which loose solder and other foreign material may be removed by a blower, by dipping the circuit board in a suitable cleansing liquid, or in any other convenient way.

To these ends, the invention provides a combined insulating and stand-off cover for electrical circuit elements such as transistors. This cover may be injection molded or otherwise fabricated of plastic or other suitable material. The cover has a cap to fit over the body of the circuit element and stand-off legs or lugs which project from the rim of the cap for seating against the circuit board. These lugs space the circuit element and its insulating cap from the circuit board, such that foreign particles, such as loose solder, may be removed from between the circuit element and the circuit board with the aid of a blower or by dipping the circuit board in a suitable cleansing liquid. The stand-off lugs are integral with the cap, whereby the present combined insulating and stand-off cover may be mass produced at low cost by an injection molding process. Moreover, assembly of the cover on a circuit element, such as a transistor entails the single simple step of slipping the cover over the element.

One unique feature of the disclosed embodiment of the invention residues in the fact that the combination insulating and stand-off cover is designed to snap over the circuit element to be protected in such a way as to prevent inadvertent separation of the cover from the element. This snap action may be accomplished by providing the stand-off lugs with inner detent-like projections and providing the lugs with lateral resiliency, whereby the projections or detents will snap over the bottom lip or rim of the circuit element when the cover is installed on the element. According to another feature of the invention, the combined insulating and stand-off cover may be formed with integral yieldable detents which are designed to engage the circuit element and to yield in such a way as to compensate for manufacturing tolerances in the cross-sectional dimensions of the element. In this way, vibration of the circuit element within the cover as well as vibration of the cover with respect to the circuit element is prevented.

DESCRIPTION OF THE PREFERRED EMBODIMENT

Figures 1, 2, 3, 4, 5:
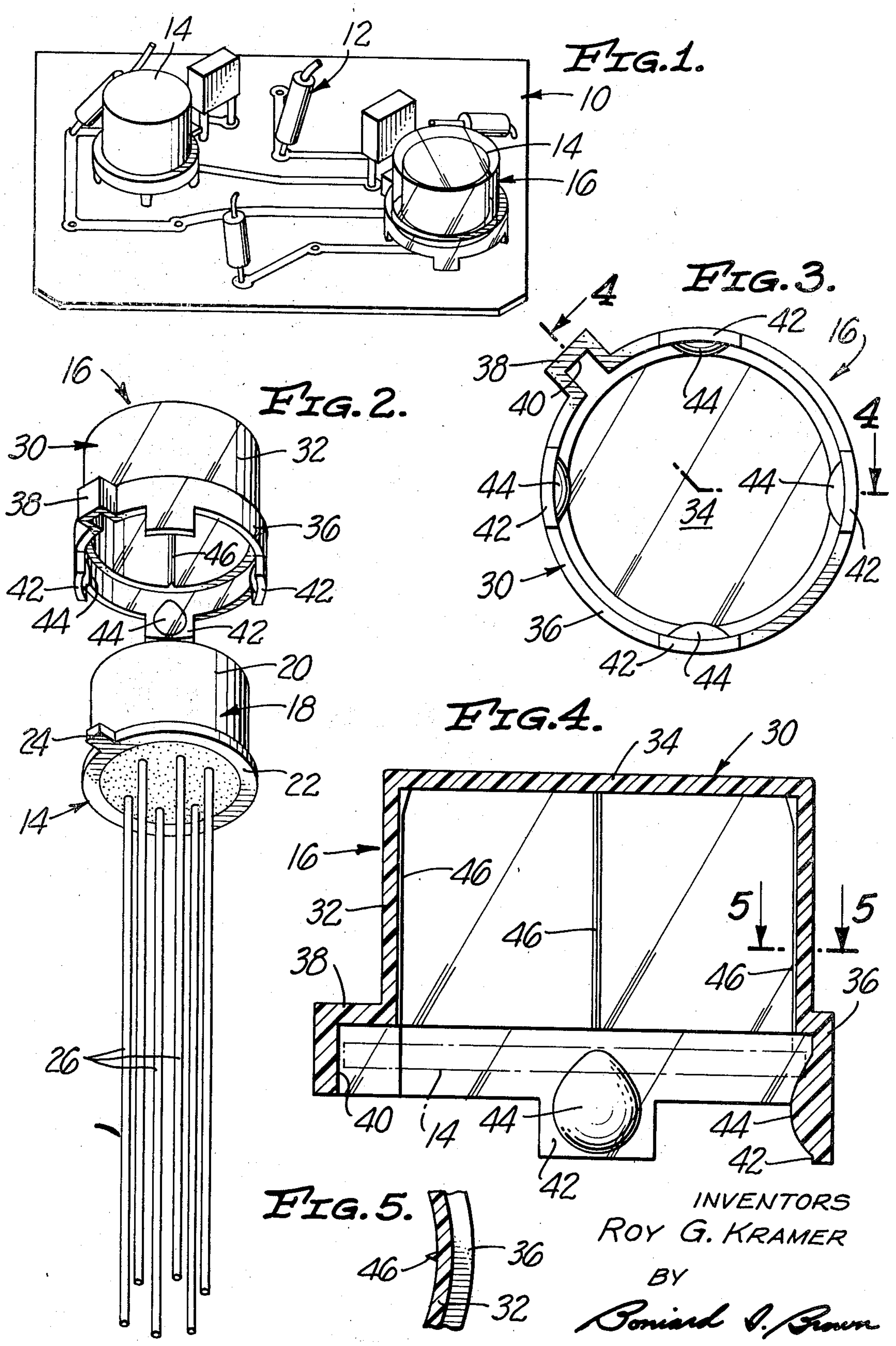
FIG. 1 is a perspective view of a circuit board mounting a number of circuit elements including a transistor which is enclosed within a combined insulating and stand-off cover according to the invention.
FIG. 2 is an exploded perspective view illustrating a transistor prior to attachment to a circuit board and a present combined insulating and stand-off cover prior to assembly on the transistor.
FIG. 3 is a bottom view of the insulating and stand-off cover in FIG. 2 on slightly enlarged scale.
FIG. 4 is an enlarged cross-section taken on line 4—4 in FIG. 3 illustrating, in broken lines, a transistor positioned within the cover.
FIG. 5 is an enlarged section taken on line 5—5 in FIG. 4.

Referring now to the drawings, and particularly to FIG. 1, there is illustrated an electrical circuit board 10 mounting a number of electrical circuit elements which are collectively designated by the reference numeral 12. Among these circuit elements are transistors 14. The present invention provides a combined insulating and stand-off cover 16 for certain of the circuit elements, in this instance, the transistors 14.

The transistors 14 are conventional commercial items and thus need not be described in detail. Suffice it to say that each transistor has a generally cylindrical body 18 including an outer metallic case 20 with an annular lip or rim 22 about one end. Projecting radially from this rim is an indexing or locating lug 24. A number of fine wire leads or terminals 26 extend from the latter end of the transistor body. The transistors 14 are installed on the circuit board 10 in the well-known way by inserting their terminals 26 through holes in the circuit board and soldering or otherwise welding the terminals to appropriate conductors on the board. The terminals are generally made quite long and are cut off flush with the underside of the circuit board after installation.

Turning now to the subject matter of the present invention, that is, the combined insulating and stand-off cover 16, the latter will be seen to comprise a cap 30 having a generally cylindrical side wall 32 and an end wall 34 closing the cap at one end. The opposite end of the cap is open. Surrounding the open end of the cap is an annular rim 36. The internal and external diameters of this rim are slightly greater than the corresponding diameters of the cap wall 32. Cap rim 36 has a lateral projection 38 containing a notch or slot 40 which opens radially inward to the interior of the cap and laterally through the open end of the cap. Projecting from the rim, longitudinally of the cap, are a number of circumferentially spaced stand-off legs or lugs 42 of equal length. In this instance, the cover has four stand-off lugs 42.

Cover 16 is constructed of an electrical insulating material, such as plastic. Nylon, for example, has been found to be a particularly suitable plastic for the present cover. The cover may be fabricated in various ways but is preferably injection molded, since this process is ideally suited to mass production of the cover.

In use, the present combined insulating and stand-off cover 16 is applied or assembled on a transistor 14 by sliding or pressing the cap 30 of the cover downwardly over the transistor body 18 until the latter bottoms against the end wall 34 of the cap. The cover is oriented in such a way that the indexing lug 24 on the transistor enters the notch or slot 40 in the cover. Cover 16 is so dimensioned that when thus installed, the cap 30 of the cover encloses the metallic case 20 of the transistor with a snug fit, and the stand-off lugs 42 of the cover project beyond the rim 22 of the transistor case, as shown best in FIG. 4. The transistor terminals or leads 26 then extend through the open end of the cover cap 30 and beyond the ends of the stand-off lugs. The transistor 14 with its cover 16 is then installed on the circuit board 10 by inserting the transistor terminals or leads 26 through their receiving holes on the board, in the manner explained earlier. The transistor terminals are thus inserted through the circuit board to a final position of installation wherein the stand-off lugs 42 on the combined insulating and stand-off cover 16 seat against the circuit board. At this point, the transistor terminals are soldered or otherwise welded to the circuit board conductors, after which the terminals are snipped off flush with the circuit board.

It will now be understood that the present transistor cover 16 serves the dual function of electrically insulating the metallic case 18 of the transistor 14 from other conductors on the circuit board and spacing the case from the circuit board. The cover thus prevents electrical shorts resulting from contact of the transistor case with adjacent circuit conductors on the circuit board. Also, the cover provides an open space between the transistor and the circuit board from which any loose solder or other foreign matter may be removed in the manner explained earlier.

Conceivably, the cap 30 of the present combination insulating and stand-off cover 16 may be internally dimensioned to receive the transistor case 18 with a sufficiently snug fit to retain the cover on the transistor. According to a feature of the invention, however, the stand-off lugs 42 of the cover are made laterally resilient and provided with inner detents 44 which snap over the transistor case rim or flange 22 when the cover is installed. These detents, then, serve to firmly lock the cover on the transistor. It will be understood that the resiliency of the stand-off lugs 42 permits these lugs to spring outwardly sufficiently to enable the detents to pass over the transistor rim during installation of the cover 16. When the detents move beyond the rim, the stand-off lugs spring inwardly again to engage their detents 44 under the rim, as indicated in FIG. 4.

According to another feature of the invention, the cap 30 of the combined insulating and stand-off cover 16 is equipped with a number of internal circumferentially spaced yieldable detents 46 which engage the transistor case 20 and yield, as required, under the pressure of these detents against the transistor case to accommodate for manufacturing tolerances in the diameter of the case. These detents are dimensioned so that the smallest transistor case will fit snugly within the cover cap 30. Vibration of the transistor within the cover as well as vibration of the cover relative to the transistor are thereby prevented. Preferably, the cap 30 is made sufficiently transparent or translucent to permit identification data and the like imprinted on the transistor to be read through the cap.

What is claimed as new in support of Letters Patent is:

1. A combination insulating and stand-off cover for an electrical circuit element such as a transistor having a body and terminals extending from one end of said body for connection to a circuit board, said cover comprising:

a unitary molded plastic cap having an open end bounded by an annular rim, and laterally resilient stand-off lugs projecting from said rim axially of said cap, said cap being internally dimensioned to fit over said circuit element body in a manner such that said lugs project beyond said one end of said body for seating against said circuit board to space said body from said board and said element terminals extend beyond said lugs for connection to said circuit board, and integral molded detents on the inner surfaces of said lugs engageable over said one end of said element body for retaining said cover on said element body.

2. A cover according to claim 1 wherein:

said cap comprises a transparent plastic, whereby identifying data on said circuit element may be read through said plastic.

3. In combination:

an electrical circuit element such as a transistor having a body and terminals extending from one end of said body for connection to a circuit board, and a unitary molded plastic insulating and stand-off cover including a cap fitting over said body, laterally resilient stand-off lugs projecting longitudinally from said cap beyond said one end of said body, and detents on the inner surfaces of said lugs engageable over said one end of said body for retaining said cover on said body.

4. The combination according to claim 3 wherein:

said plastic comprises a transparent plastic, whereby identifying data on said circuit element may be read through said cap.

References Cited

UNITED STATES PATENTS

| | | | |
|---|---|---|---|
| 3,122,679 | 2/1964 | Kislan et al. | |
| 3,229,939 | 1/1966 | Hubbard ---------- | 174—138.5 |
| 3,383,481 | 5/1968 | Bailey et al. | |

OTHER REFERENCES

Grove, Ger. Appl. No. 1,047,273, publ. December 1958, 1 sheet drawing, 2 pp. spec.

ROBERT K. SCHAEFER, Primary Examiner

D. SMITH, Jr., Assistant Examiner

U.S. Cl. X.R.

174—52; 220—60; 317—101